United States Patent
Park

(10) Patent No.: US 10,298,195 B2
(45) Date of Patent: May 21, 2019

(54) RADIO FREQUENCY FILTER EMPLOYING NOTCH STRUCTURE

(71) Applicant: KMW INC., Hwaseong-si (KR)

(72) Inventor: Nam-Shin Park, Gyeonggi-do (KR)

(73) Assignee: KMW INC., Hwaseong-si (KR)

( * ) Notice: Subject to any disclaimer, the term of this patent is extended or adjusted under 35 U.S.C. 154(b) by 0 days.

(21) Appl. No.: 15/704,014

(22) Filed: Sep. 14, 2017

(65) Prior Publication Data

US 2018/0006623 A1    Jan. 4, 2018

Related U.S. Application Data

(60) Division of application No. 14/172,236, filed on Feb. 4, 2014, now abandoned, which is a continuation of application No. PCT/KR2012/006247, filed on Aug. 6, 2012.

(30) Foreign Application Priority Data

Aug. 5, 2011  (KR) ........................ 10-2011-0078275

(51) Int. Cl.
*H01P 1/208* (2006.01)
*H03H 7/01* (2006.01)
*H01P 1/205* (2006.01)

(52) U.S. Cl.
CPC ......... *H03H 7/0115* (2013.01); *H01P 1/2053* (2013.01); *H01P 1/2084* (2013.01)

(58) Field of Classification Search
CPC ...... H01P 1/2053; H01P 1/208; H01P 1/2084; H03H 7/0115

USPC .... 333/202, 203, 208, 212, 219–219.2, 227, 333/230
See application file for complete search history.

(56) References Cited

U.S. PATENT DOCUMENTS

| | | | |
|---|---|---|---|
| 4,216,448 A | 8/1980 | Kasuga et al. | |
| 5,781,085 A | 7/1998 | Harrison | |
| 5,936,490 A | 8/1999 | Hershtig | |
| 6,037,541 A | 3/2000 | Bartley et al. | |
| 6,262,639 B1 | 7/2001 | Shu et al. | |
| 6,342,825 B2 | 1/2002 | Hershtig | |
| 6,356,171 B2 | 3/2002 | Fiedziuszko et al. | |
| 6,836,198 B2 | 12/2004 | Engst | |
| 7,236,098 B1 | 6/2007 | Kline et al. | |
| 7,915,978 B2 | 3/2011 | Zhang et al. | |

(Continued)

FOREIGN PATENT DOCUMENTS

| | | |
|---|---|---|
| CN | 200997430 Y | 12/2007 |
| CN | 201163655 A | 12/2008 |
| EP | 1041662 A2 | 10/2000 |

(Continued)

OTHER PUBLICATIONS

International Search Report for PCT/KR2012/006247, dated Feb. 14, 2013, and its English translation.

(Continued)

*Primary Examiner* — Patrick O Neill

(57) ABSTRACT

The present invention relates to a radio frequency filter employing a notch structure, wherein the notch structure is a dual notch structure which comprises: a C notch structure formed in a predetermined region at a partition between two cavities to be cross-coupled; and an L notch structure formed together with the C notch structure in a predetermined region at a partition between two cavities.

19 Claims, 23 Drawing Sheets

(56) References Cited

U.S. PATENT DOCUMENTS

2001/0000657 A1   5/2001  Hershtig
2003/0117241 A1   6/2003  Engst

FOREIGN PATENT DOCUMENTS

| EP | 1715544 A1 | 10/2006 |
|---|---|---|
| JP | 53-090741 A | 8/1978 |
| JP | 59-80002 A | 5/1984 |
| JP | 07-015208 A | 1/1995 |
| JP | 2000-114809 A | 4/2000 |
| JP | 2000-295010 A | 10/2000 |
| JP | 2001185906 A | 7/2001 |
| JP | 2010226469 A | 10/2010 |
| KR | 10-2001-0112381 A | 12/2001 |
| KR | 10-0844163 B1 | 6/2008 |
| KR | 10-2009-0035342 A | 4/2009 |
| KR | 10-2011-0018793 A | 2/2011 |

OTHER PUBLICATIONS

International Preliminary Report for PCT/KR2012/006247, dated Feb. 11, 2014, and its English translation.
Written Opinion for PCT/KR2012/006247, dated Feb. 14, 2013, and its English translation.
Chinese Examination Report dated Oct. 11, 2016 for Chinese Patent Application No. 201280038399.1 and its English translation.
Japanese Office Action dated Jun. 27, 2016 for Japanese Patent Application No. 2015-150995.
Japanese Office Action dated Jul. 15, 2016 for Japanese Patent Application No. 2015-14359.

RADIO FREQUENCY FILTER EMPLOYING NOTCH STRUCTURE

CROSS-REFERENCE TO RELATED APPLICATIONS

This is a divisional application of U.S. application Ser. No. 14/172,236, filed on Feb. 4, 2014, now pending, which is a continuation application of International Application No. PCT/KR2012/006247, filed on Aug. 6, 2012, which claims priority to Korean Application No. 10-2011-0078275, filed on Aug. 5, 2011, the entire disclosure of which are incorporated herein by reference.

TECHNICAL FIELD

The present invention relates to a radio frequency filter for use in a wireless communication system, and more particularly, to a radio frequency filter employing a notch structure.

BACKGROUND ART

The term "radio frequency filter (hereinafter, referred to as 'filter') refers to an apparatus for performing a function of passing or filtering signals in any predetermined frequency band, which is classified into a low pass filter, a band pass filter, a high pass filter, a band stop filter and the like according to a frequency band to be filtered.

The filter has an important characteristic such as an insertion loss and a skirt feature. The insertion loss means electric power to be lost when the signals pass through the filter, and the skirt feature means a steep extent of a passing band and a filtering band of the filter.

The insertion loss and the skirt feature have a trade-off relationship with each other according to the number of stages (degrees) of the filter. As the stages of the filter increase, the skirt feature becomes better but the insertion loss becomes worse.

In order to improve the skirt feature of the filter without the stages of the filter being increased, a method of forming a notch (reduction pole) is generally used. This is a method capable of enhancing the skirt feature of the filter, in which the notch is formed in a specific frequency band without the stages of the filter being increased, so as to enhance the skirt feature of the filter.

There is a cross coupling method as a most general method forming the notch. A technology relating to formation of the notch using the cross coupling method is disclosed in U.S. Pat. No. 6,342,825, entitled "Band-pass filter having tri-section", issued to Hershtig, Rafi and assigned to 'K&L Microwave Co.' on Jan. 29, 2002.

SUMMARY

The invention has been made to solve the above-mentioned problem in the prior art, and an aspect of the present invention is to provide a radio frequency filter employing a notch structure capable of providing a notch feature to the radio frequency filter.

Another aspect of the present invention is to provide a radio frequency filter employing a notch structure capable of generating notch features at both ends of a three stage filter and a four stage filter.

In accordance with an aspect of the present invention, a radio frequency filter employing a notch structure is provided. The radio frequency filter having a dual notch structure includes: a C type notch structure formed on a predetermined portion of a partition between two cavities to be cross coupled; and an L type notch structure formed along the C type notch structure.

Advantageous Effect

As described above, the radio frequency filter employing the notch structure according to the present invention has a more efficient structure capable of providing multiple notch features to the radio frequency filter, particularly, allowing a generation of the notch feature in both the three stage filter and the four stage filter.

DETAILED DESCRIPTION

Hereinafter, an exemplary embodiment of the present invention will be described in detail with reference to the accompanying drawings.

Figure 1:
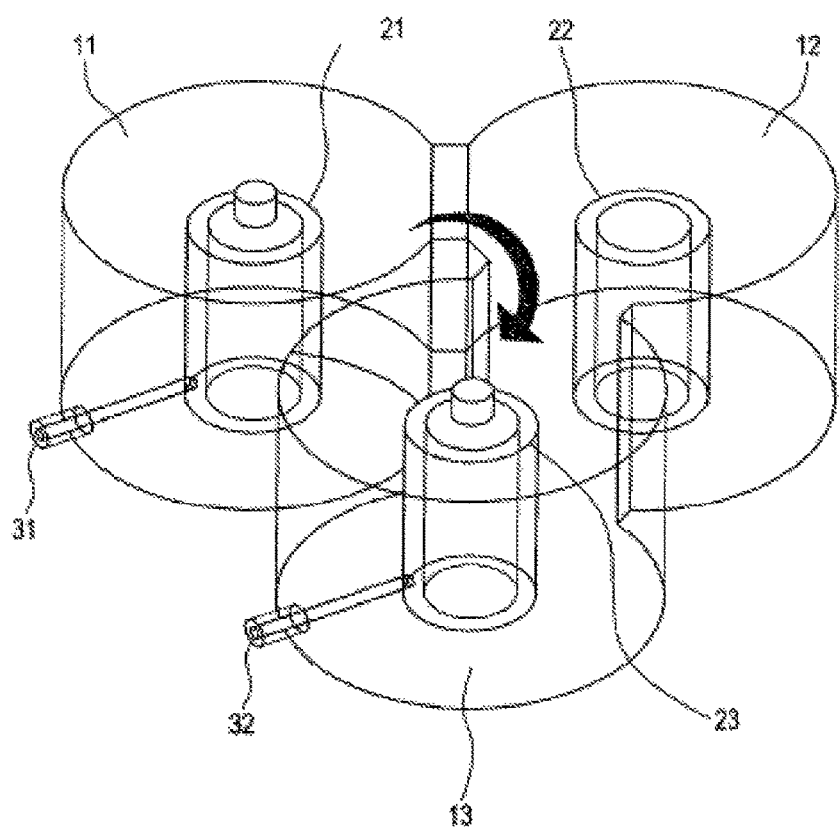
FIG. 1 is a schematic view illustrating a structure of a general three stage filter.
Figure 2:
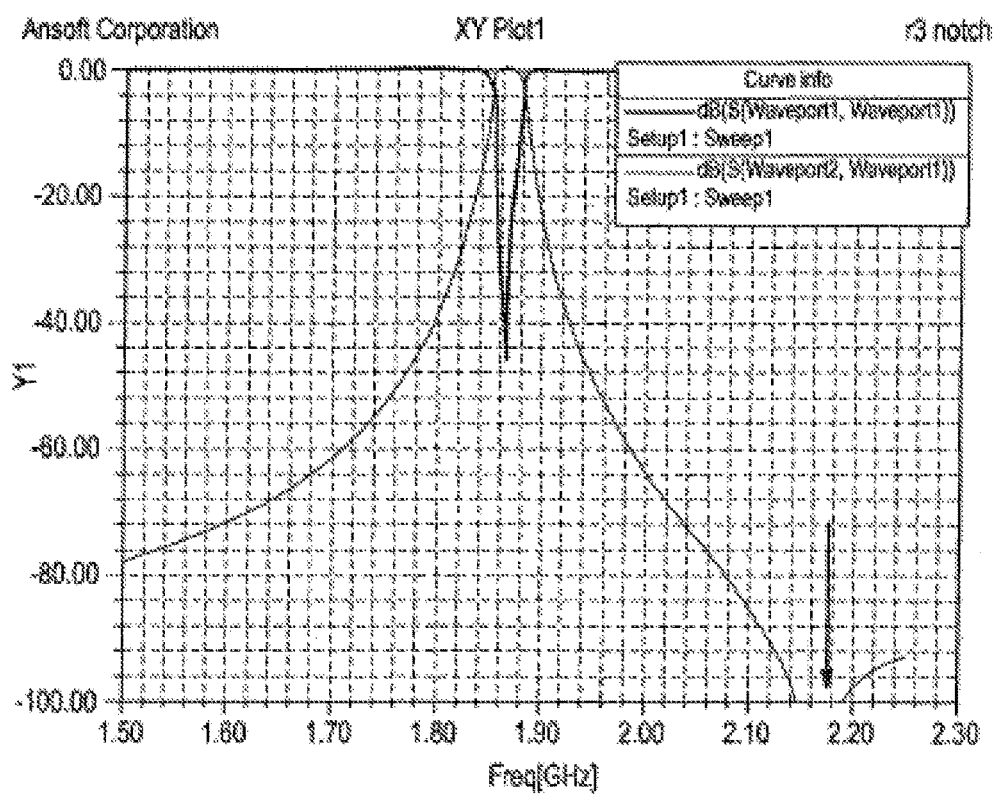
FIG. 2 is a graph illustrating a frequency filtering characteristic of the three stage filter shown in FIG. 1.
Figure 3:
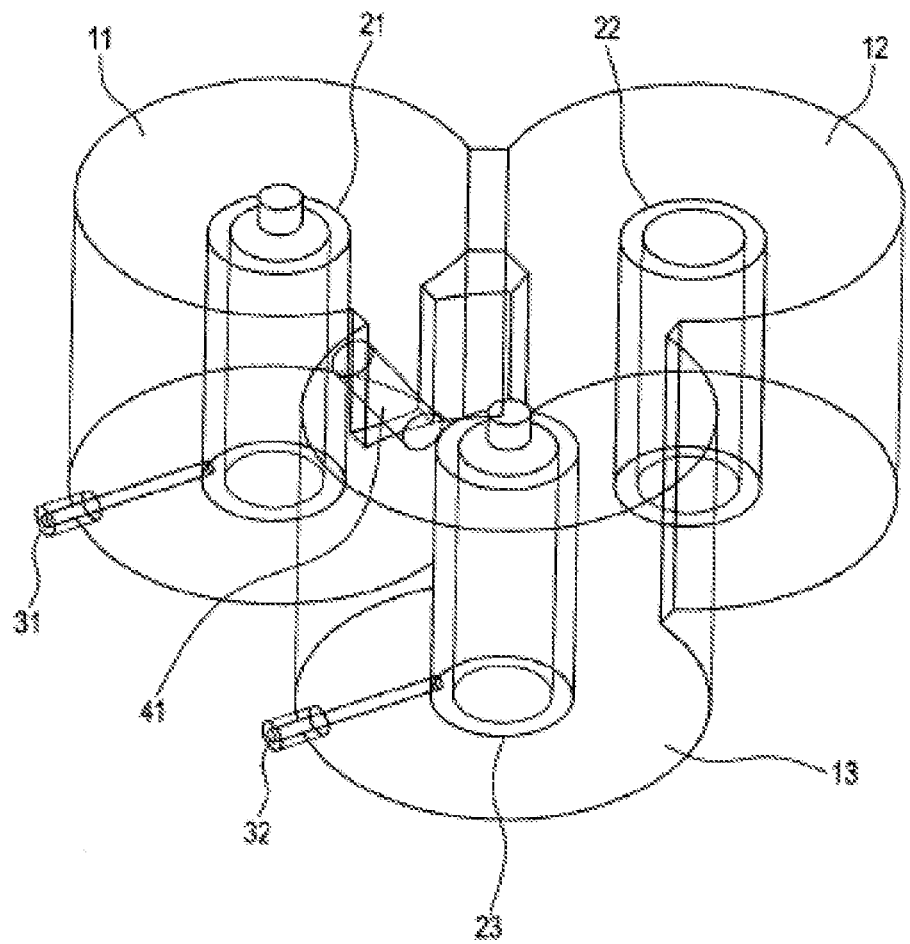
FIG. 3 is a schematic view illustrating a structure of the three stage filter employing a general notch structure.
Figure 4:
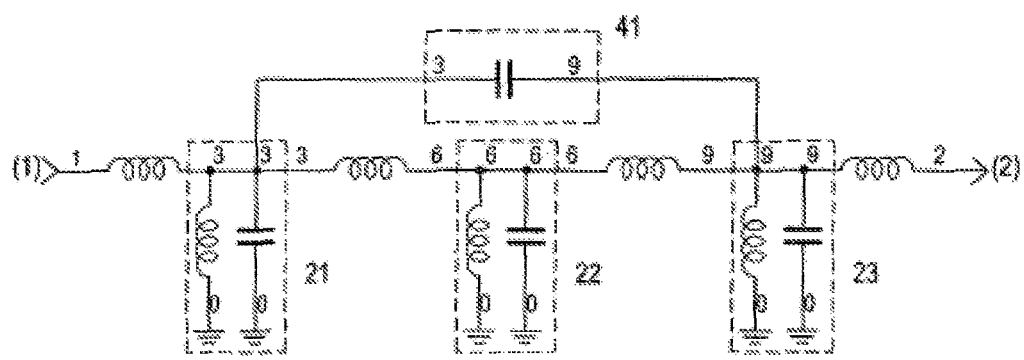
FIG. 4 is a circuit diagram illustrating an equivalent circuit of the three stage filter shown in FIG. 3.
Figure 5:
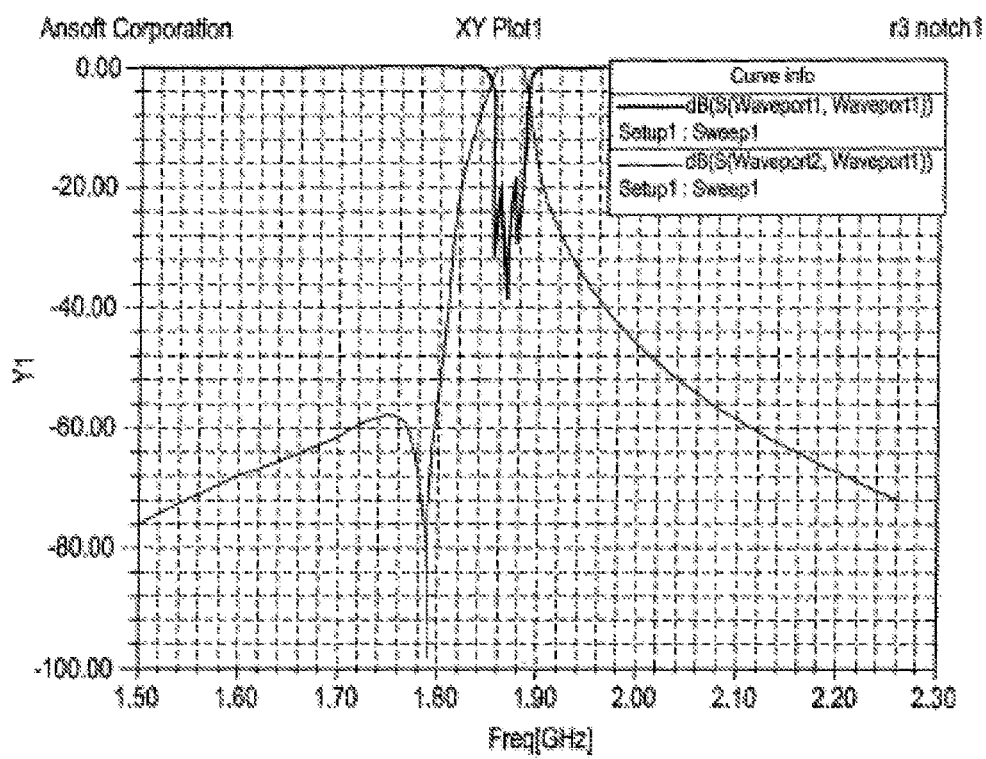
FIG. 5 is a graph illustrating a frequency filtering characteristic of the three stage filter shown in FIG. 3.

Firstly, referring to FIGS. 1 to 5, formation of a notch using a cross-coupling will be described. FIG. 1 is a schematic perspective view illustrating a structure of a general three stage filter, and FIG. 2 is a graph illustrating a frequency filtering characteristic of the three stage filter shown in FIG. 1. FIG. 3 is a schematic perspective view illustrating a structure of the three stage filter employing a notch structure, FIG. 4 is a circuit diagram illustrating an equivalent circuit of the three stage filter shown in FIG. 3, and FIG. 5 is a graph illustrating a frequency filtering characteristic of the three stage filter shown in FIG. 3.

Typically, the filter has a structure in that a multiple dielectric substances or metallic resonators are connected by multiple stages in a plurality of cavities defined by a metal housing and a cover, and in FIGS. 1 and 3, the illustration of the structure of the metal housing will be omitted for convenience of the description.

Referring to FIGS. 1 and 3, a three stage filter has a structure in which a first cavity 11, a second cavity 12, and a third cavity 13 are cross-coupled with one another, and have a first resonator 21, a second resonator 22, and a third resonator 23, respectively. The first resonator 21 of the first cavity 11 is connected with an input connector 31 to receive an input signal, and the third resonator 13 of the third cavity 13 is connected with an output connector 32 to provide an output signal.

Accordingly, a signal input into the input connector 31 is output to the output connector 32 after sequentially passing the first resonator 21, the second resonator 22, and the third resonator 23, as indicated by an arrow in FIG. 1.

In the filter having no the notch structure as shown in FIG. 1, only a sequential coupling between adjacent resonators is basically established, while in the filter employing a capacity (C) type notch structure 41 as shown in FIG. 3, a cross coupling between the resonators, which are not adjacent, is achieved.

The C type notch structure 41 has a metal stick forming a capacitance coupling between the first resonator 21 and the third resonator 23 as an important structure. The metal stick penetrates an inner wall partitioning the first and third cavities 11 and 13. At this time, the metal stick is covered with a supporting substance of a dielectric material (not shown) such as Teflon in order to electrically isolate the metal stick from the inner wall, and joined to the inner wall. At this time, the inner wall may have a through-hole structure formed therein in which the metal stick is installed, or may have a lower portion at which the metal stick is installed. However, since it is difficult to form the through-hole in the inner wall in an operating process, an upper end of the inner wall is partially cut off, and the metal stick covered with the supporting substance is generally installed on the corresponding cut off portion. Such a supporting substance functions as an insulation of the metal stick, and also is fixed to the corresponding portion at which the metal stick is installed because of an engagement with the cut off portion of the inner wall, resulting in a fixing of the metal stick.

Referring to FIGS. 2 and 4, it is understood that the three stage filter having the C type notch structure 41 shown in FIG. 3 creates a notch at a lower portion of a processing band (a low frequency band of the processing band), in comparison with the general three stage filter.

A four or more stage filter may employ an inductor (L) type notch structure as well as the C type notch structure 41, in which the L type notch structure is constituted in the form of a window formed in the partition between the receiving spaces of two resonators to be cross-coupled, and creates an inductance coupling between both resonators.

The three stage filter shown in FIG. 1 has no separate notch structure, but since a weak coupling is created between the first resonator 21 of the first stage filter and the third resonator 23 of the third stage filter through the third resonator 23 of the third stage filter, a weak L type notch may be formed without hardly having effect on the filtering characteristic.

In the above-described structure, particularly, the three stage filter, the notch structure must have been employed only between the first stage and the third stage. It has been recognized that it has been difficult to implement multiple notches or to create notches at both ends of the processing bands, that is, a lower end and an upper end of the processing band, without a special structure being added inside or outside of the filter.

Figure 6:
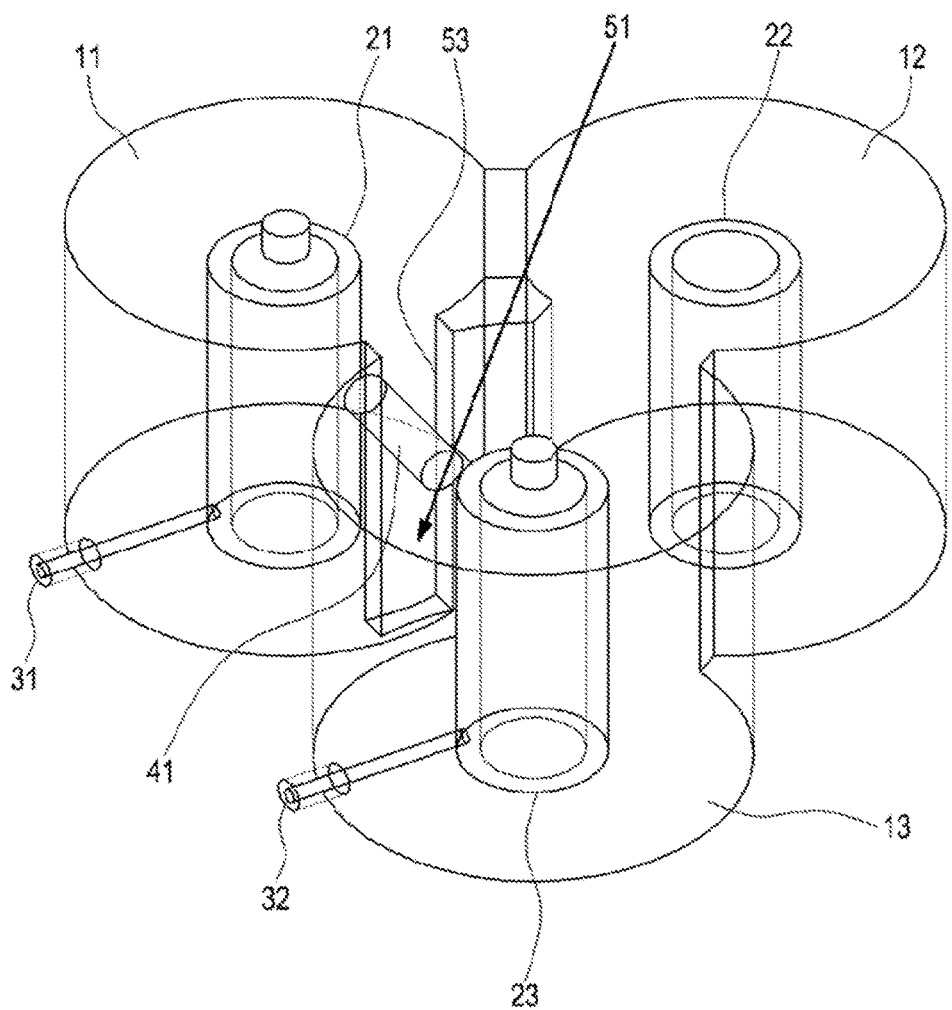
FIG. 6 is a schematic view illustrating a structure of the three stage filter employing a notch structure according to a first embodiment of the present invention.
Figure 7:
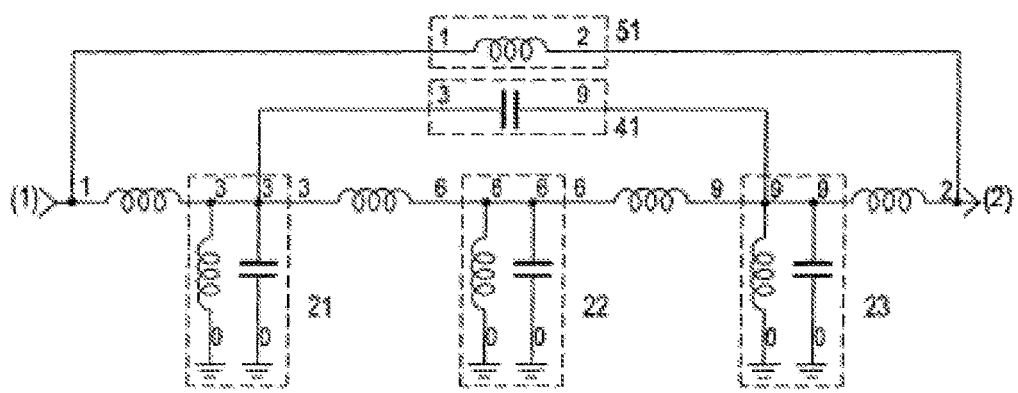
FIG. 7 is a circuit diagram illustrating an equivalent circuit of the three stage filter shown in FIG. 6.
Figure 8:
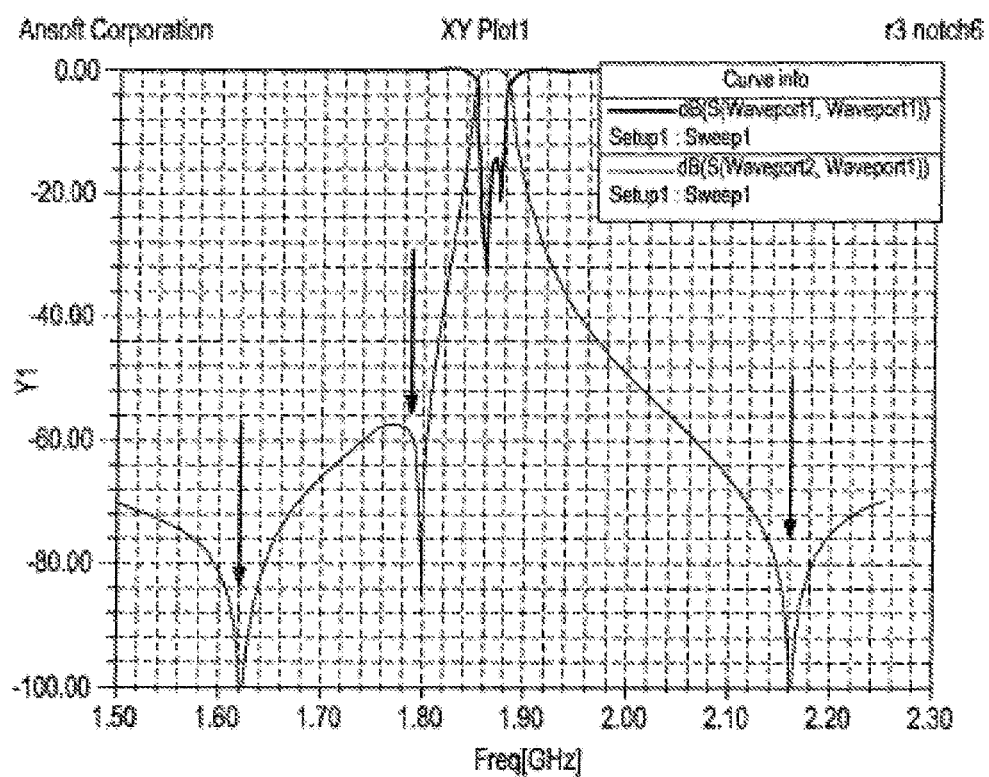
FIG. 8 is a graph illustrating a frequency filtering characteristic of the three stage filter shown in FIG. 3.

FIG. 6 is a schematic perspective view illustrating a structure of the three stage filter employing a notch structure according to a first embodiment of the present invention, FIG. 7 is a circuit diagram illustrating an equivalent circuit of the three stage filter shown in FIG. 6, and FIG. 8 is a graph illustrating the frequency filtering characteristic of the three stage filter shown in FIG. 3. In FIG. 6, similarly to FIGS. 1 and 3, it is omitted to show the structure of the metal housing for the convenience of the description.

Referring to FIG. 6, the three stage filter employing the notch structure according to the first embodiment of the present invention includes a first cavity 11, a second cavity 12 and a third cavity 13, which are arranged in the triangular form and sequentially coupled, and which include a first resonator 21, a second resonator 22, and a third resonator 23, respectively. The first resonator 21 of the first cavity 11 is connected with an input connector 31 to receive an input signal, and the third resonator 13 of the third cavity 13 is connected with an output connector 32 to provide an output signal.

At this time, according to the characteristic of the present invention, the C type notch structure 41 is installed to the partition between the first cavity 11 and the third cavity 13 to be cross-coupled, and in addition the L type notch structure 51 of the window structure 53 extends to a lower end of the C type notch structure 41 and is formed on the partition. In FIG. 6, although it is shown that the L type notch structure 51 has an identical width to the cut-off portion of the partition in order to install the C type notch structure 41, the L type notch structure 51 is slightly narrower than the width of the cut-off portion on which the C type notch structure 41, i.e., a step portion, is installed, so that the supporting substance is rigidly fixed to the partition on which the C type notch structure 41 is installed.

As shown in FIG. 6, the notch structure according to the first embodiment of the present invention may be regarded as a dual notch structure in which the C type notch structure 41 and the L type notch structure 51 are complex.

As described above, if the three stage filter employs the dual notch structure of the present invention, it is understood that the notches are created at both ends of the processing band of the filter as indicated by an arrow in FIG. 8. That is, two notches are created at the lower end of the processed band, while one notch is created at an upper end of the processed band.

Figure 9:
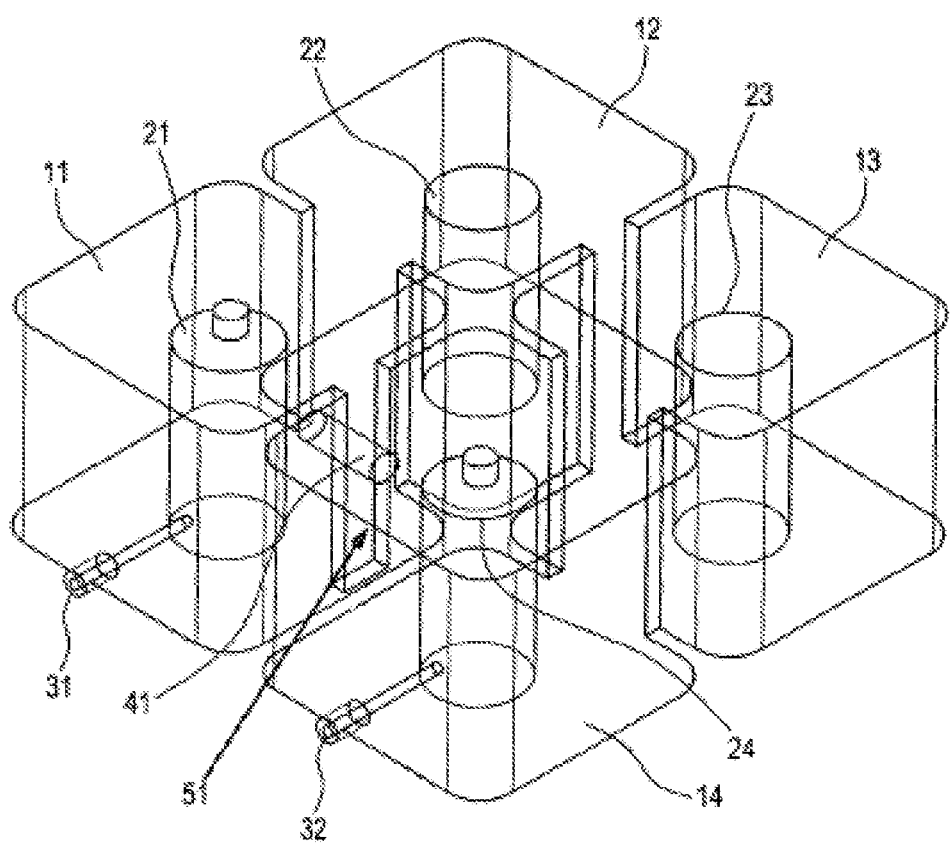
FIG. 9 is a schematic view illustrating a structure of four stage filter employing a notch structure according to a second embodiment of the present invention.
Figure 10:
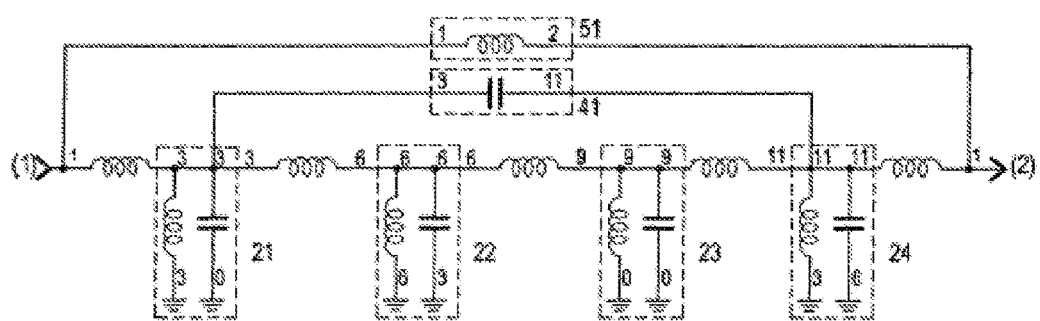
FIG. 10 is a circuit diagram illustrating an equivalent circuit of the four stage filter shown in FIG. 9.
Figure 11:
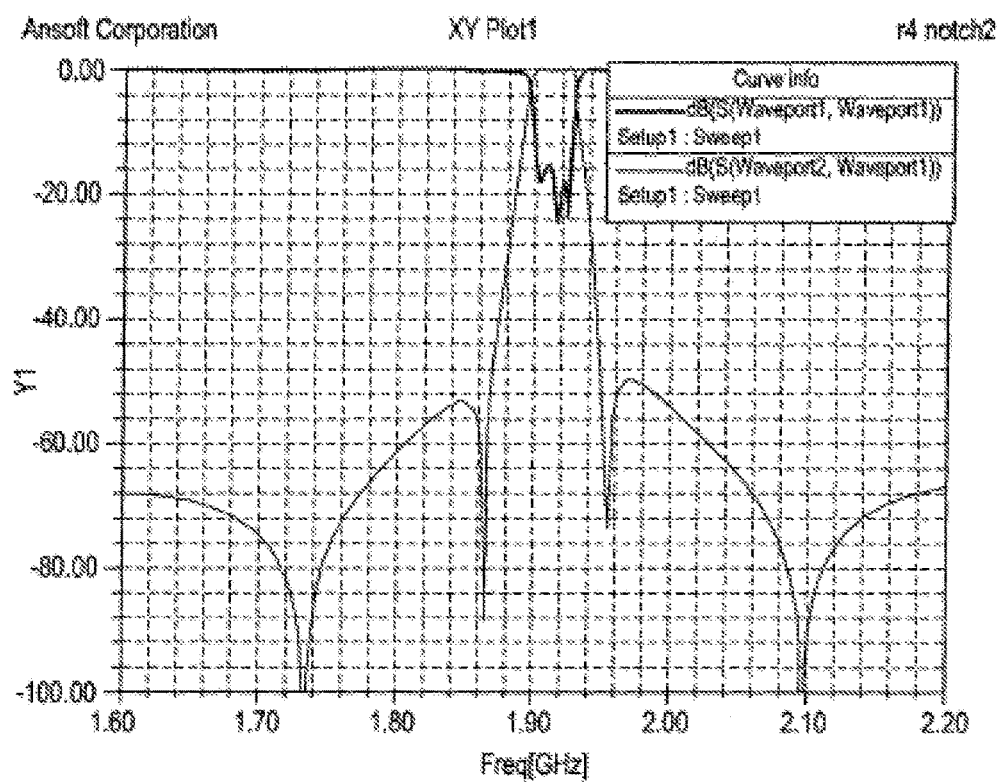
FIG. 11 is a graph illustrating a frequency filtering characteristic of the four stage filter shown in FIG. 9.

FIG. 9 is a schematic perspective view illustrating the structure of the four stage filter employing the notch structure according to the second embodiment of the present invention, FIG. 10 is a circuit diagram illustrating an equivalent circuit of the four stage filter, and FIG. 11 is a graph illustrating a frequency filtering characteristic of the four stage filter in FIG. 9.

Referring to FIG. 9, the four stage filter employing the notch structure according to the second embodiment of the present invention has a structure in that a first cavity 11, a second cavity 12, a third cavity 13 and a fourth cavity 14 are arranged in two columns and sequentially coupled with each other in two pairs. The first, second, third and fourth cavities 11, 12, 13 and 14 have a first, second, third and fourth resonators 21, 22, 23 and 24 respectively. The first resonator 21 of the first cavity 11 is connected with an input connector 31 to receive an input signal, and the fourth resonator 14 of the fourth cavity 14 is connected with an output connector 32 to provide an output signal.

At this time, according to the characteristic of the present invention, the C type notch structure 41 is installed to the partition between the first cavity 11 and the fourth cavity 14, and in addition the L type notch structure 51 of the window structure extends to a lower end of the C type notch structure 41 and is formed on the partition. That is, the notch structure according to the characteristic of the present invention shown in FIG. 9 may have a similar structure to the dual notch structure shown in FIG. 6.

As described above, if the four stage filter employs the dual notch structure of the present invention, it is understood that the notches are created at both ends of the processing band of the filter as shown in FIG. 11. That is, two notches are created at the lower and upper ends of the processing band, so as to implement the dual notches which are symmetrical to left and right.

Figure 12:
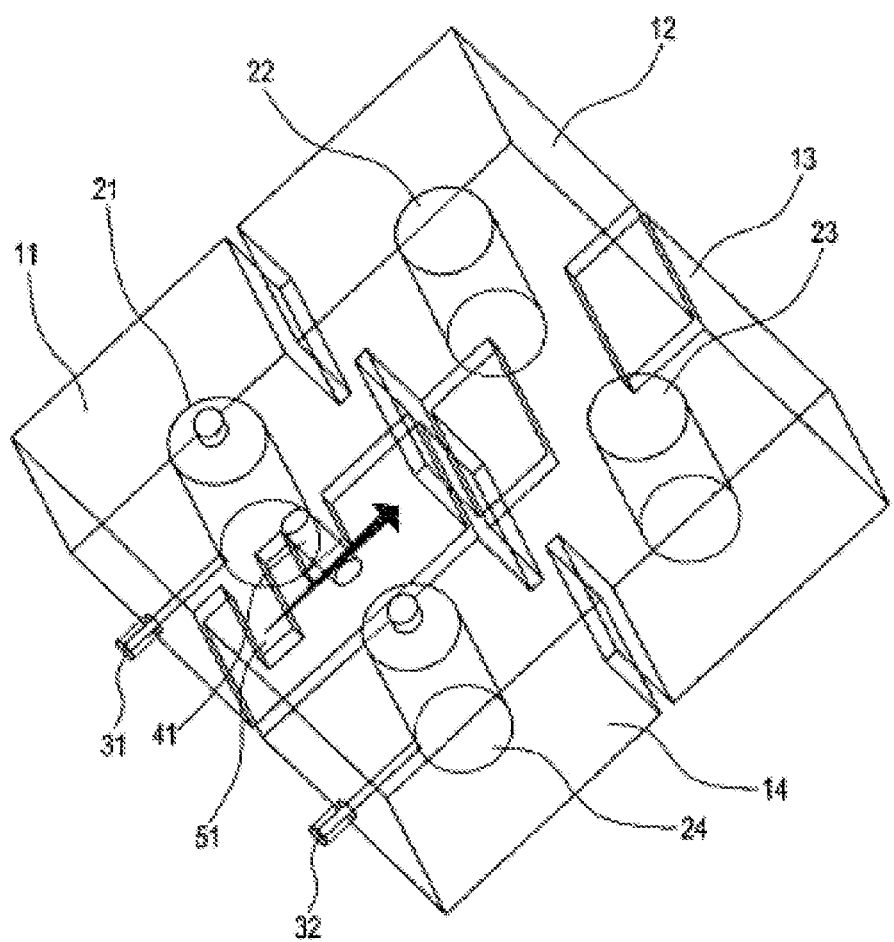
FIG. 12 is a schematic view illustrating a structure of the four stage filter employing a notch structure according to a third embodiment of the present invention.
Figure 13:
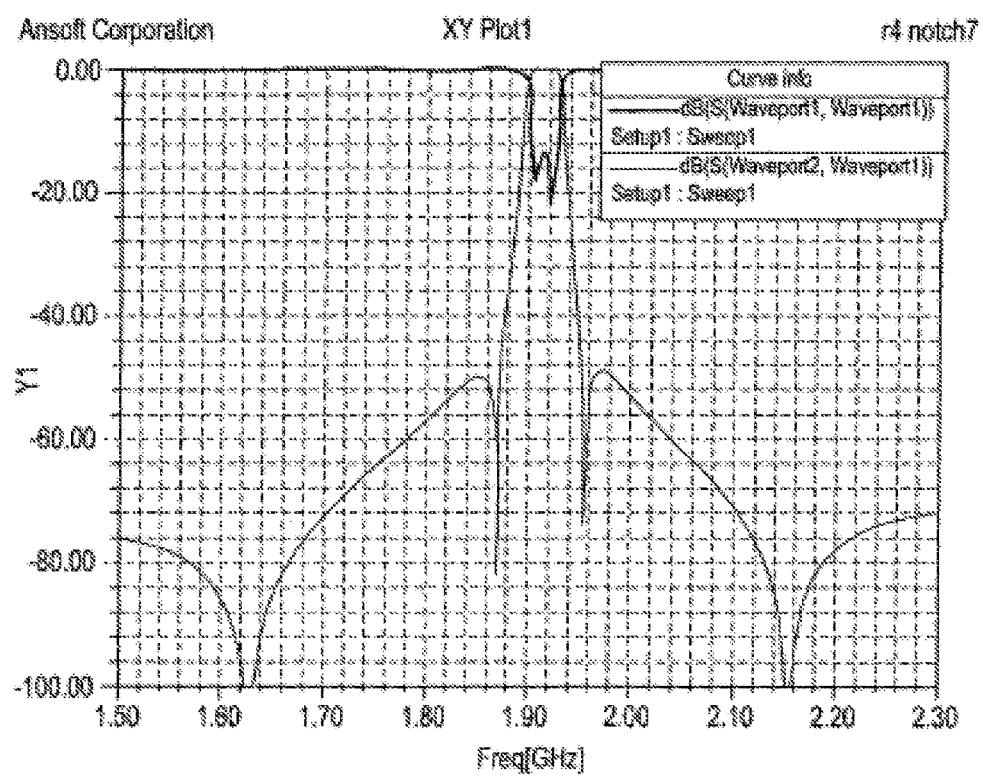
FIG. 13 is a graph illustrating a frequency filtering characteristic of the four stage filter shown in FIG. 12.

FIG. 12 is a schematic perspective view illustrating a structure of the four stage filter employing a notch structure according to the third embodiment of the present invention, and FIG. 13 is a graph illustrating the frequency filtering characteristic of the four stage filter of FIG. 12. The equivalent circuit of the notch structure according to the third embodiment shown in FIG. 12 is identical to the equivalent circuit of the second embodiment shown in FIG. 10.

Referring to FIG. 12, the four stage filter employing the notch structure according to the third embodiment of the present invention has a structure in that a first cavity 11, a second cavity 12, a third cavity 13 and a fourth cavity 14 are sequentially coupled with one another, similarly to the third embodiment shown in FIG. 9. Each of the first resonator 12, the second resonator 22, the third resonator 23 and the fourth resonator 24 is prepared for each cavity. The first resonator 21 of the first cavity 11 is connected with an input connector 31 to receive an input signal, and the fourth resonator 14 of the fourth cavity 14 is connected with an output connector 32 to provide an output signal.

At this time, according to the characteristic of the present invention, the C type notch structure 41 is installed to the partition between the first cavity 11 and the fourth cavity 14, and in addition the L type notch structure 51 of the window structure is formed at another region on the partition, differently from the C type notch structure 41. The C type notch structure 41 is formed at a center portion of the partition by reference of a plane surface, and the L type notch structure 51 is formed on any side of the partition to correspond to the C type notch structure 41.

If the L type notch structure 51 and the C type notch structure 41 are separately installed on the partition, it is easy to separately tune the L type notch and the C type notch.

In the case of employing the dual notch structure according to the third embodiment of the present invention as described above, as shown in FIG. 13, it is noted that the filter has the filter characteristic almost similar to the filter characteristic according to the second embodiment as shown in FIG. 11.

On the other hand, in FIG. 12, it is shown that the L type notch structure 51 is formed at a position near the input connector 31 and the output connector 32. However, as indicated by an arrow in FIG. 12, the L type notch structure 51 may be formed. In this case, the filter also may have a similar characteristic. In this case, however, the notch characteristic may be weak.

Figure 14:
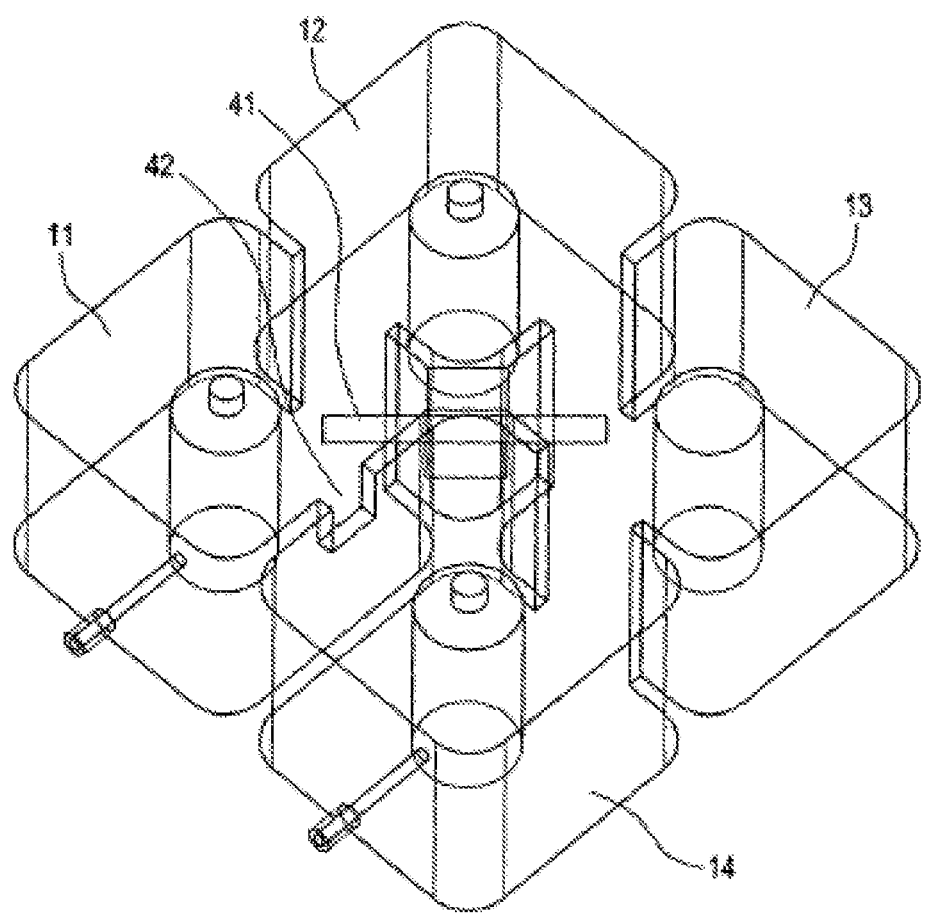
FIG. 14 is a schematic view illustrating a structure of a generally considered four stage filter.
Figure 15:
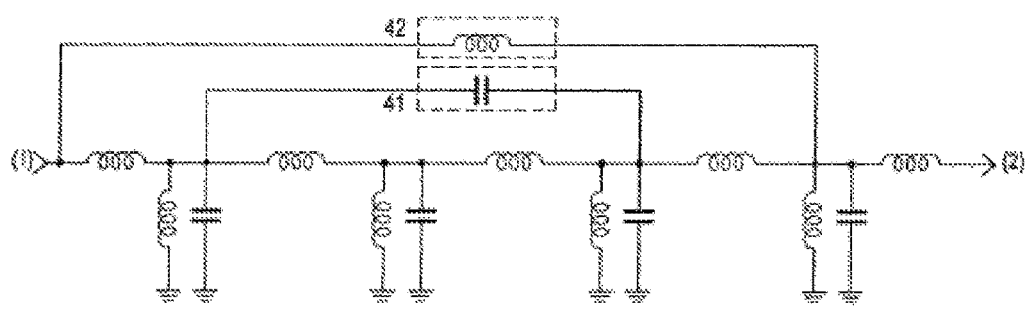
FIG. 15 is a circuit diagram illustrating an equivalent circuit of the four stage filter shown in FIG. 14.
Figure 16:
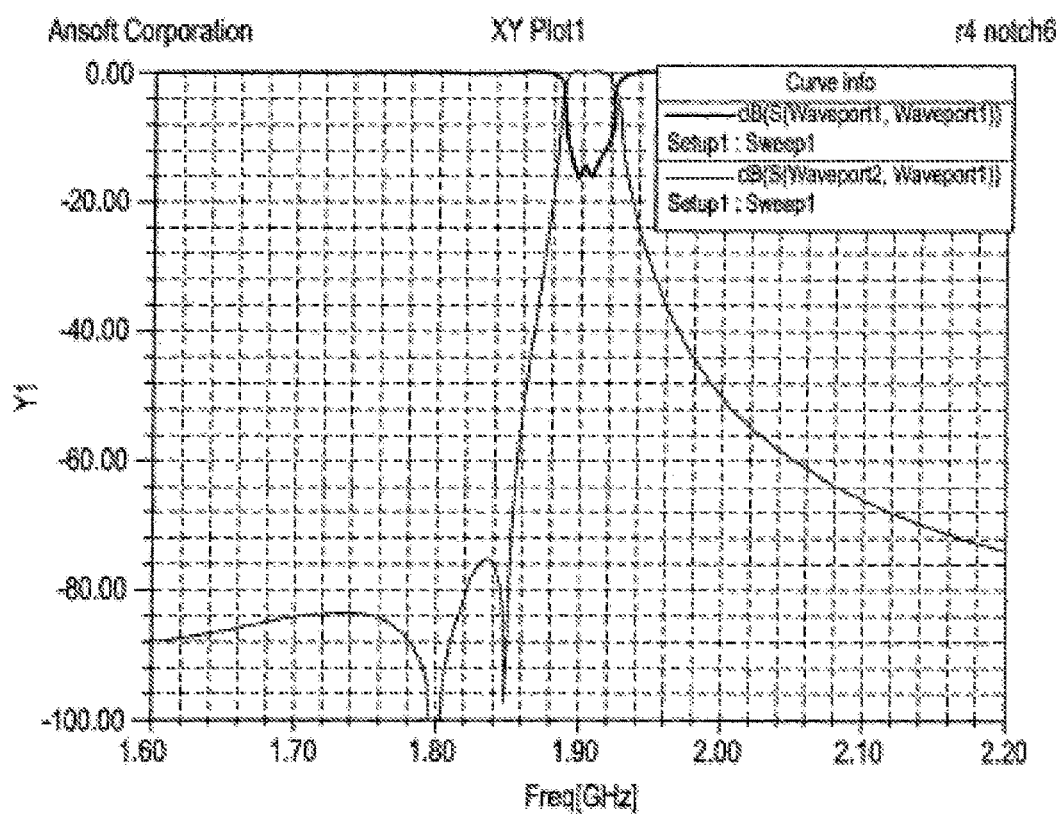
FIG. 16 is a graph illustrating a frequency filtering characteristic of the four stage filter shown in FIG. 14.

FIG. 14 is a schematic perspective view illustrating a structure of a generally considered four stage filter, FIG. 15 is a circuit diagram illustrating an equivalent circuit of the four stage filter of FIG. 14, and FIG. 16 is a graph illustrating a frequency filtering characteristic of the four stage filter of FIG. 14.

Referring to FIGS. 14 to 16, the four stage filter employing the generally considered notch structure will be described. In comparison with the four stage filter according to the characteristic of the present invention, the four stage filter shown in FIG. 14 has a C type notch structure 41 installed on a partition interposed between the first cavity 11 and the third cavity 13, and the general L type notch structure 42 may be interposed between the first cavity 11 and the fourth cavity 14.

As described above, it is understood that only two notches are created in the four stage filter employing the notch structure as shown in FIG. 14.

Figure 17:
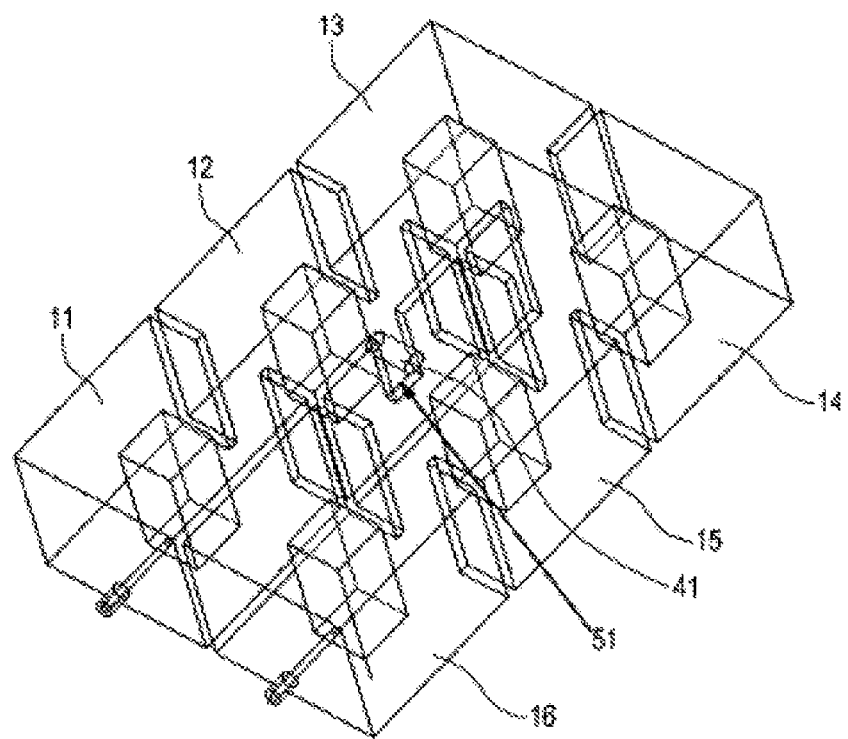
FIG. 17 is a schematic view illustrating a structure of six stage filter employing a notch structure according to a fourth embodiment of the present invention.
Figure 18:
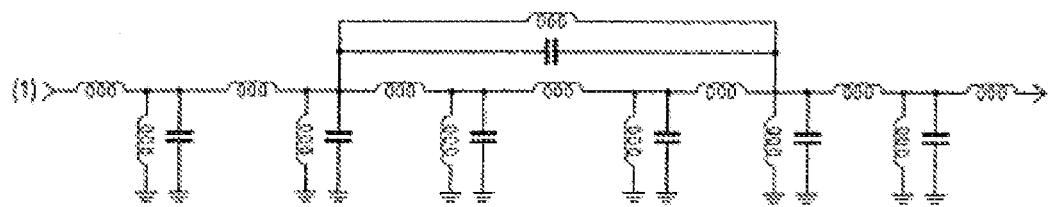
FIG. 18 is a circuit diagram illustrating an equivalent circuit of the six stage filter shown in FIG. 17.
Figure 19:
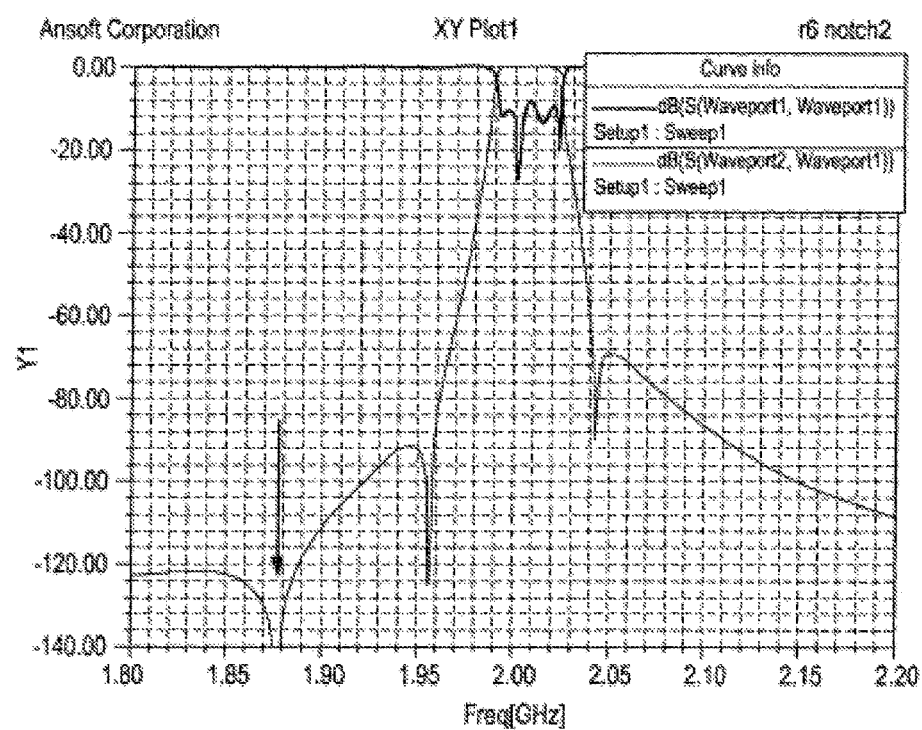
FIG. 19 is a graph illustrating a frequency filtering characteristic of the six stage filter in FIG. 17.

FIG. 17 is a schematic perspective view illustrating the structure of the six stage filter employing the notch structure according to the fourth embodiment of the present invention, FIG. 18 is a circuit diagram illustrating an equivalent circuit of the six stage filter, and FIG. 19 is a graph illustrating a frequency filtering characteristic of the six stage filter in FIG. 17.

Referring to FIG. 17, the six stage filter employing the notch structure according to the fourth embodiment of the present invention has a structure in that a first cavity 11, a second cavity 12, a third cavity 13, a fourth cavity 14, a fifth cavity 15, and a sixth cavity 16 are arranged in two columns, each of which has three cavities, and are sequentially coupled with each other.

At this time, according to the characteristic of the present invention, the C type notch structure 41 is installed to the partition between the second cavity 12 and the fourth cavity 15, and in addition the L type notch structure 51 of the window structure extends to a lower end of the C type notch structure 41 and is formed on the partition. That is, the notch structure according to the characteristic of the present invention shown in FIG. 17 may have a similar structure to the dual notch structure shown in FIG. 9.

In the case that the six stage filter employs the dual notch structure of the present invention as described above, it is understood that an additional notch is created at a lower end of the processing band of the filter as indicated by an arrow in FIG. 19.

Figure 20:
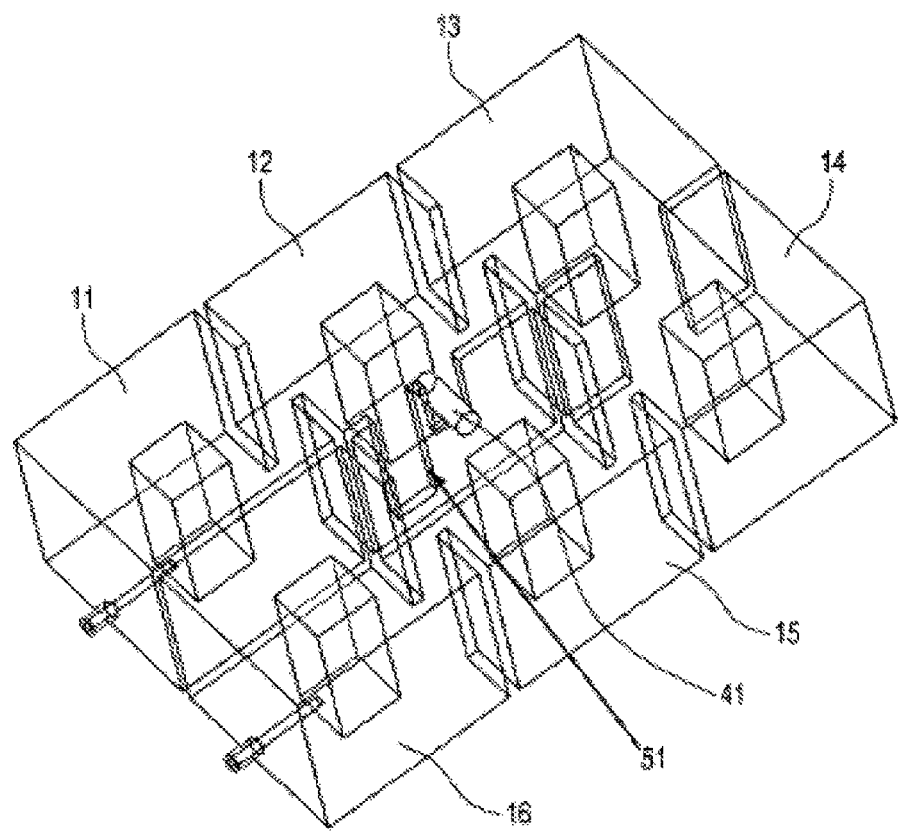
FIG. 20 is a schematic view illustrating a structure of the six stage filter employing a notch structure according to a fifth embodiment of the present invention.
Figure 21:
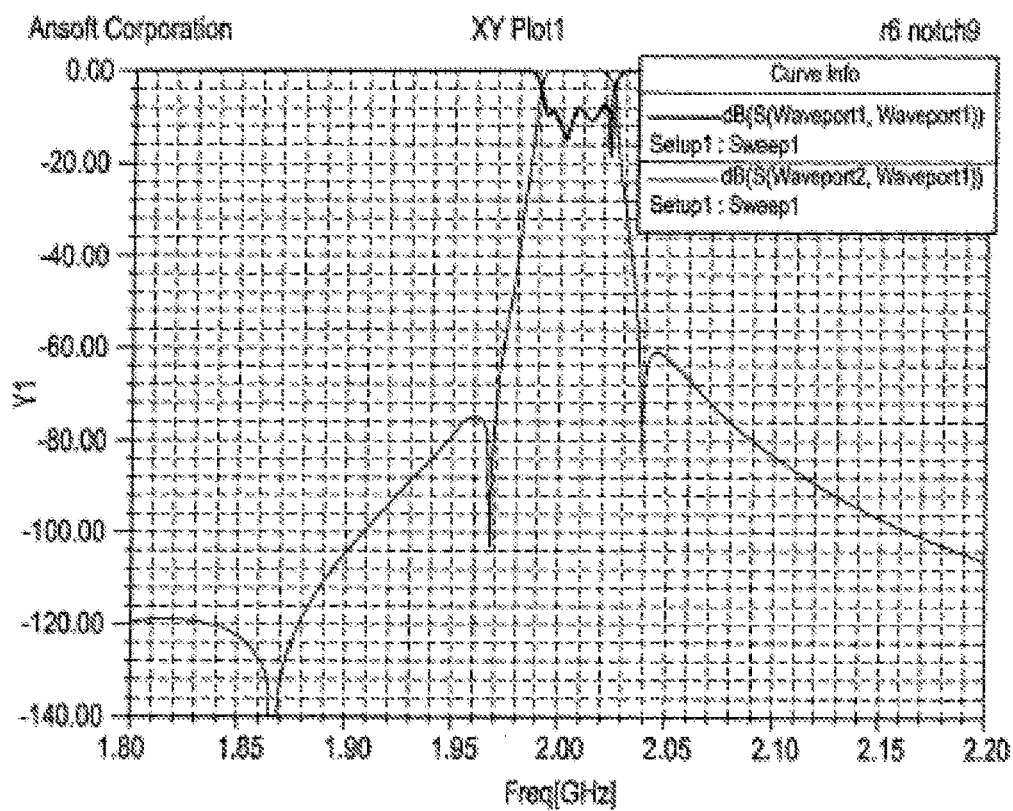
FIG. 21 is a graph illustrating a frequency filtering characteristic of the six stage filter shown in FIG. 20.

FIG. 20 is a schematic perspective view illustrating a structure of a six stage filter employing a notch structure according to the fifth embodiment of the present invention, and FIG. 21 is a graph illustrating the frequency filtering characteristic of the six stage filter of FIG. 20. The equivalent circuit of the notch structure according to the fifth embodiment shown in FIG. 20 may be identical to the equivalent circuit of the fourth embodiment shown in FIG. 18.

Referring to FIG. 20, in the six stage filter employing the notch structure according to the fifth embodiment of the present invention, the C type notch structure 41 is installed on a partition between the second cavity 12 and the fourth cavity 15, similarly to the filter in FIG. 17. The L type notch structure 51 of a window structure may be formed at another region on the partition, separately from the C type notch structure 41. That is, the notch structure according to the characteristic of the present invention shown in FIG. 20 may have a similar structure to the dual notch structure shown in FIG. 12.

In the case of employing the dual notch structure according to the fifth embodiment of the present invention as described above, as shown in FIG. 21, it is noted that the filter has the filter characteristic almost similar to the filter characteristic according to the fourth embodiment as shown in FIG. 19.

Figure 22:
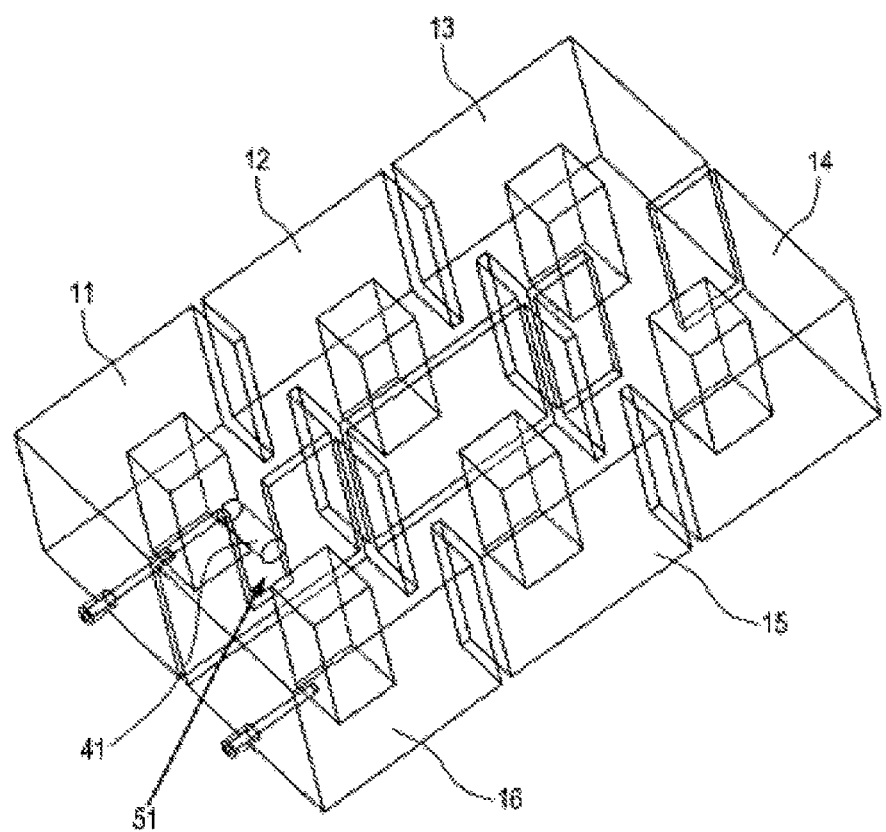
FIG. 22 is a schematic view illustrating a structure of the six stage filter employing a notch structure according to a sixth embodiment of the present invention.
Figure 23:
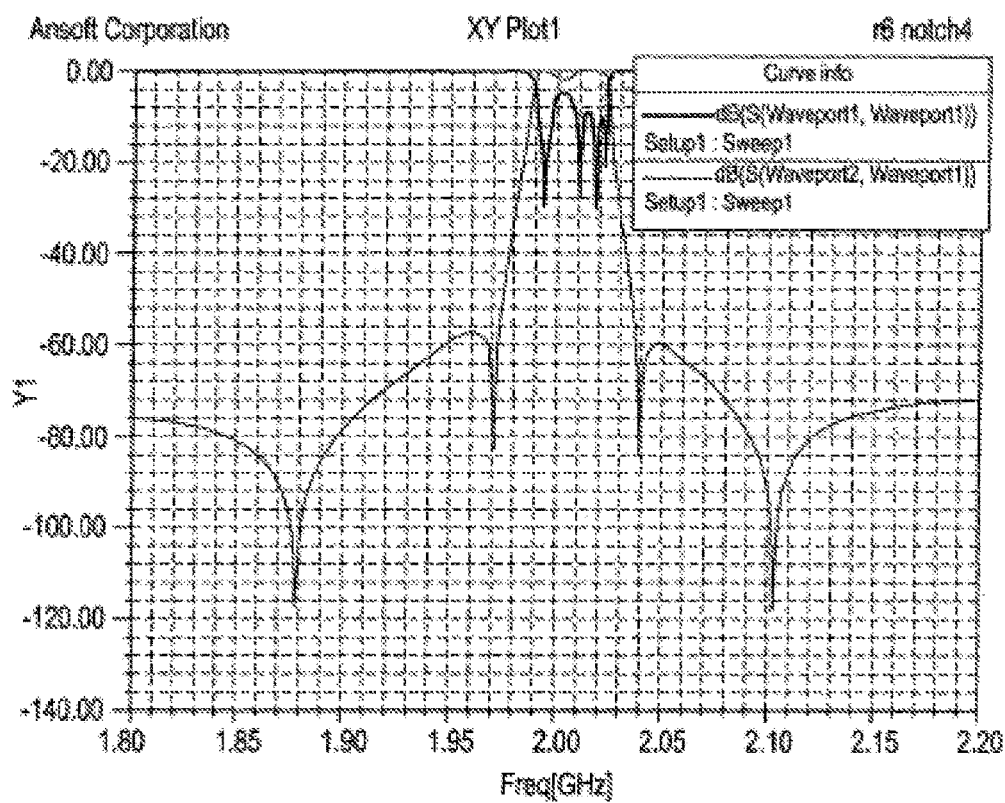
FIG. 23 is a graph illustrating a frequency filtering characteristic of the six stage filter shown in FIG. 22.

FIG. 22 is a schematic perspective view illustrating a structure of the six stage filter employing a notch structure according to the sixth embodiment of the present invention, and FIG. 23 is a graph illustrating the frequency filtering characteristic of the six stage filter of FIG. 22.

Referring to FIG. 22, the six stage filter employing the notch structure according to the sixth embodiment of the present invention has a similar structure to the structures of the embodiments shown in FIGS. 17 and 20, but has the difference in that the C type notch structure 41 and the L notch type structure 51 extending to a lower end of the C type notch structure 41 are formed at a first stage, i.e., a partition between a first cavity 11 and a sixth cavity 16.

In view of the filtering characteristic of the filter having the structure, as shown in FIG. 23, two notches are created at each of a lower end and an upper end of the processing band of the filter.

As described above, the radio frequency filter employing the notch structure according to the embodiments of the present invention may be implemented, and also the notch structure according to the characteristic of the present invention may be applied to multiple stage filters having more than the six stages, beyond the above-described embodiments. Further, two or more dual notch structures having a combination of the L type notch and the C type notch according to the characteristic of the present invention may be employed to the multiple stage filters having more stage than the six stage filter. Furthermore, the general L type notch structure or the general C type notch structure is adjustably incorporated with the dual notch structure according to the characteristic of the present invention, and a combination of the L type notch or the C type notch with the dual notch structure may be employed to the filter.

The invention claimed is:

1. A filter, comprising:
   first and second cavities which are cross-coupled;
   a partition provided between the first and second cavities;
   a C type notch structure formed at a first region on the partition; and
   an L type notch structure formed adjacent to the C type notch structure at a second region of the partition between the two cavities,
   wherein the L type notch structure is formed physically separate from the C type notch structure, the C type notch structure includes a first window, the first window extends from a top of the partition towards a bottom of the partition, the L type notch structure includes a second window that extends beyond a bottom of the first window towards the bottom of the partition,
   wherein the L type notch structure is formed at a position nearer than the C type notch structure to an input connector for receiving an input signal and an output connector for providing an output signal.

2. The filter as claimed in claim 1, wherein the first region corresponds to a center of the partition when viewed from above, and the second region is closer to an edge of the partition than the first region.

3. The filter as claimed in claim 1, wherein the second window extends from the top of the partition towards the bottom of the partition and reaches the bottom of the partition.

4. The filter as claimed in claim 1, wherein a width of the second window is constant throughout a length direction of the second window.

5. The filter as claimed in claim 1, wherein the filter further comprises third and fourth cavities, wherein the first and third cavities are arranged in a pair in a first row and the second and fourth cavities are arranged in a pair in a second row, the first, third, fourth, and the second cavities are sequentially coupled in order.

6. The filter as claimed in claim 1, wherein the filter further comprises third, fourth, fifth and sixth cavities, wherein the first, the third, and the fifth cavities are arranged in a first row, the second, forth, and the sixth cavities are arranged in a second row, the first, third, fifth, sixth, fourth, and second cavities are sequentially coupled in order.

7. The filter as claimed in claim 1, wherein a width of the first window is constant throughout a length direction of the first window.

8. The filter as claimed in claim 1, further comprising a housing which includes a cover and one or more side walls to enclose the first and second cavities,
   wherein the second window is located between the first window and the closest side wall among the one or more side walls.

9. The filter as claimed in claim 1, wherein the C type notch structure includes a metal stick which passes through the first window.

10. The filter as claimed in claim 1, wherein a top of the first window is open.

11. A communication apparatus comprising a radio frequency filter,
   wherein the filter comprises:
   first and second cavities which are cross-coupled;
   a partition provided between the first and second cavities;
   a C type notch structure formed at a first region on the partition; and
   an L type notch structure formed adjacent to the C type notch structure at a second region of the partition between the two cavities,
   wherein the L type notch structure is formed physically separate from the C type notch structure, the C type notch structure includes a first window, the first window extends from a top of the partition towards a bottom of the partition, the L type notch structure includes a second window that extends beyond a bottom of the first window towards the bottom of the partition, wherein the L type notch structure is formed at a position nearer than the C type notch structure to an input connector for receiving an input signal and an output connector for providing an output signal.

12. The communication apparatus as claimed in claim 11, wherein the first region corresponds to a center of the partition when viewed from above, and the second region is closer to an edge of the partition than the first region.

13. The communication apparatus as claimed in claim 11, wherein the second window extends from the top of the partition towards the bottom of the partition and reaches the bottom of the partition.

14. The communication apparatus as claimed in claim 11, wherein a width of the second window is constant throughout a length direction of the second window.

15. The communication apparatus as claimed in claim 11, wherein the radio frequency filter further comprises third and fourth cavities, wherein the first and third cavities are arranged in a pair in a first row and the second and fourth cavities are arranged in a pair in a second row, the first, third, fourth, and the second cavities are sequentially coupled in order.

16. The communication apparatus as claimed in claim 11, wherein the radio frequency filter further comprises third, fourth, fifth and sixth cavities, wherein the first, the third, and the fifth cavities are arranged in a first row, the second, forth, and the sixth cavities are arranged in a second row, the first, third, fifth, sixth, fourth, and second cavities are sequentially coupled in order.

17. The communication apparatus as claimed in claim 11, wherein a width of the first window is constant throughout a length direction of the first window.

18. The communication apparatus as claimed in claim 11, wherein the radio frequency filter further comprises a housing which includes a cover and one or more side walls to enclose the first and second cavities,
wherein the second window is located between the first window and the closest side wall among the one or more side walls.

19. The communication apparatus as claimed in claim 11, wherein the C type notch structure includes a metal stick which passes through the first window.

* * * * *